United States Patent
Yoon

(10) Patent No.: US 7,733,738 B2
(45) Date of Patent: Jun. 8, 2010

(54) SEMICONDUCTOR MEMORY DEVICE AND A DATA WRITE AND READ METHOD THEREOF

(75) Inventor: Yoon-Hwan Yoon, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 357 days.

(21) Appl. No.: 11/348,787

(22) Filed: Feb. 7, 2006

(65) Prior Publication Data

US 2006/0179260 A1 Aug. 10, 2006

(30) Foreign Application Priority Data

Feb. 7, 2005 (KR) .................... 10-2005-0011439

(51) Int. Cl.
*G11C 8/00* (2006.01)
(52) U.S. Cl. .............................. 365/233.1; 365/189.04; 365/230.01
(58) Field of Classification Search ............ 365/189.01, 365/233, 233.5, 230.01
See application file for complete search history.

(56) References Cited

U.S. PATENT DOCUMENTS

| | | | |
|---|---|---|---|
| 5,602,781 A * | 2/1997 | Isobe .................... | 365/189.05 |
| 5,892,723 A * | 4/1999 | Tanaka et al. ............... | 365/207 |
| 5,953,285 A | 9/1999 | Churchill et al. ........... | 365/233 |
| 6,327,175 B1 | 12/2001 | Manapat et al. ............. | 365/154 |
| 6,430,651 B1 * | 8/2002 | Isobe ........................ | 711/104 |
| 6,791,898 B1 * | 9/2004 | Manapat et al. ........ | 365/233.11 |
| 2001/0024382 A1* | 9/2001 | Shimoyama et al. ... | 365/189.01 |
| 2002/0023200 A1* | 2/2002 | Ryan et al. .................. | 711/167 |
| 2002/0071332 A1* | 6/2002 | Nishiyama et al. ..... | 365/230.01 |
| 2003/0128620 A1* | 7/2003 | Nakazato ............... | 365/230.05 |
| 2004/0190363 A1* | 9/2004 | Shigenami et al. ..... | 365/230.03 |

FOREIGN PATENT DOCUMENTS

KR 2002-0089992 11/2002

\* cited by examiner

*Primary Examiner*—Vu A Le
*Assistant Examiner*—Han Yang
(74) *Attorney, Agent, or Firm*—F. Chau & Associates, LLC

(57) ABSTRACT

Provided are a semiconductor memory device and a data write and read method thereof. The semiconductor memory device includes a write data controller, an address controller, and a read data controller. The write data controller writes data received with an address to a first memory cell corresponding to the address and simultaneously stores the data in a data register. The address controller decodes and stores the address in an address register. The read data controller outputs data from a second memory cell corresponding to an address received with a data read command if the received address is different from the address stored in the address register, and outputs the data stored in the data register if the received address is equal to the address stored in the address register.

14 Claims, 3 Drawing Sheets

SEMICONDUCTOR MEMORY DEVICE AND A DATA WRITE AND READ METHOD THEREOF

CROSS-REFERENCE TO RELATED PATENT APPLICATION

This application claims priority to Korean Patent Application No. 10-2005-0011439, filed on Feb. 7, 2005, in the Korean Intellectual Property Office, the disclosure of which is incorporated by reference herein in its entirety.

BACKGROUND OF THE INVENTION

1. Technical Field

The present invention relates to a semiconductor memory device and a data write and read method thereof, and more particularly, to a semiconductor memory device and a data write and read method thereof, capable of preventing errors from being generated when a data read operation is performed in an asynchronous operation mode after a data write operation has been performed in a synchronous operation mode.

2. Discussion of the Related Art

A Pseudo Static Random Access Memory (PSRAM) is a semiconductor memory device that implements the operation of a Static Random Access Memory (SRAM) by using a memory cell array composed of Dynamic Random Access Memory (DRAM) cells and an SRAM external interface.

Recently, the PSRAM, which uses an asynchronous operation mode as its basic operation mode, has been developed to have a synchronous operation mode. In the synchronous operation mode, control signals and data, such as addresses, commands and so forth, are input or output in synchronization with a clock signal. In the asynchronous operation mode, control signals and data, such as addresses, commands and so forth, are not output in synchronization with a clock signal.

FIG. 1 is a timing diagram for explaining a late write function and a bypass read function in the asynchronous operation mode of the PSRAM.

The late write function means that when a write command is received in response to a write enable signal, an address and data received with the write command are stored in registers while the write command is activated and then written to a corresponding memory cell when a following write command is received. This is different than a normal write function, in which a received address and data are directly written to a corresponding memory cell while a write command is activated.

The bypass read function means that, when a read command is received in response to a write enable signal, if an address received with the read command is equal to an address stored in an address register, data is read from a data register instead of a memory cell.

Referring now to FIG. 1, an address "A" and data "0" are received with a write command WC1 in response to a write enable signal /WE. The write command WC1 is received at a falling edge of the write enable signal /WE. In addition, an address "X" is stored in an address register and data "1" is stored in a data register.

In a late write operation mode, during a first write period (e.g., 1 WRITE PERIOD), the data "1" stored in the data register, instead of the address "A" and data "0" received in response to a first signal S1, is written to a memory cell corresponding to the address "X".

Next, an address "B" is received with a read command RC1 in response to the write enable signal /WE during a first read period (e.g., 1 READ PERIOD). The read command RC1 is received at a rising edge of the write enable signal /WE. In this case, if data stored in a memory cell corresponding to the address "B" is "0", data "0" is read out.

The address "A" and data "0" received with the write command WC1 are then respectively stored in an address register and a data register, in response to a second signal S2. Here, the second signal S2 is activated in response to the read command RC1, and is used to control data and an address to be respectively stored in a data register and an address register.

Subsequently, an address "C" and data "1" are received with a write command WC2 in response to the write enable signal /WE during a second write period (e.g., 2 WRITE PERIOD). In the second write period, the data "1" stored in the data register is written to a memory cell corresponding to the address "A" stored in the address register in response to the first signal S1.

Next, the address "C" is received with a read command RC2 in response to the write enable signal /WE during a second read period (e.g., 2 READ PERIOD). At this time, the address "C" and the data "1" received with the write command WC2 are respectively stored in the address register and the data register in response to the second signal S2.

In the second read period, since the address "C" received with the read command RC2 is equal to the address "C" stored in the address register, the bypass read function is performed. In other words, the data "1" stored in the data register, instead of data stored in a memory cell, is output.

However, when the synchronous operation mode is converted into an asynchronous operation mode and a read operation is performed after a data write operation is performed at an address "A" in the synchronous operation mode, if a read address received with a read command is "A", data stored in a data register, instead of a corresponding memory cell, is output due to the bypass read function.

In this case, if data stored in the memory cell corresponding to the address "A" in the synchronous operation mode is different from data stored in the data register in the asynchronous operation mode, incorrect data will be output. In other words, when the data read operation is performed at the address "A" in the asynchronous operation mode after the data write operation has been performed at the address "A" in the synchronous operation mode, unexpected data may be output, thus causing an error. Accordingly, a need exists for a memory device that is capable of preventing such errors from being generated.

SUMMARY OF THE INVENTION

According to an aspect of the present invention, there is provided a semiconductor memory device comprising: a write data controller writing data received with an address to a first memory cell corresponding to the address and simultaneously storing the data in a data register; an address controller decoding and storing the address in an address register; and a read data controller outputting data from a second memory cell corresponding to an address received with a data read command if the received address is different from the address stored in the address register, and outputting the data stored in the data register if the received address is equal to the address stored in the address register.

The write data controller comprises: a synchronous operation write circuit receiving the data to be written in response to a synchronous operation mode signal and writing the data to the first corresponding memory cell in response to a first control signal; and an asynchronous operation write circuit receiving the data to be written in response to an asynchronous operation mode signal or the synchronous operation mode signal, storing the data to be written in the data register in response to the first control signal or a second control signal, and writing the data stored in the data register to the first corresponding memory cell in response to a third control signal.

The first control signal is activated in response to a write enable signal in the synchronous operation mode, the second control signal is activated in response to a data read command in the asynchronous operation mode, and the third control signal is activated in response to a data write command in the asynchronous operation mode.

The synchronous operation write circuit comprises: a first switch receiving the data to be written in response to the synchronous operation mode signal; and a second switch transmitting or blocking the data output from the first switch to or from the first corresponding memory cell in response to the first control signal, and the asynchronous operation write circuit comprises: a third switch receiving the data to be written in response to the asynchronous operation mode signal or the synchronous operation mode signal; a fourth switch transmitting or blocking the data output from the third switch in response to the first control signal or the second control signal; the data register storing the data output from the fourth switch; and a fifth switch transmitting or blocking the data stored in the data register in response to the third control signal.

The synchronous operation write circuit further comprises a first write circuit for writing the data output from the second switch to the first corresponding memory cell, and the asynchronous operation write circuit further comprises a second write circuit for writing the data output from the fifth switch to the first corresponding memory cell.

The write data controller further comprises a selector for selecting the data output from the synchronous operation write circuit or the asynchronous operation write circuit in response to the synchronous operation mode signal and the asynchronous operation mode signal, and applying the selected data to the first corresponding memory cell.

The selector comprises: a first logic gate outputting the data output from the first write circuit in response to the synchronous operation mode signal; a second logic gate outputting the data output from the second write circuit in response to the asynchronous operation mode signal; and a third logic gate receiving the output of the first logic gate and the second logic gate, performing a logic operation on the output of the first logic gate and the second logic gate and outputting a result of the logic operation to the first corresponding memory cell.

The address controller comprises: a synchronous operation address circuit receiving the address in response to the synchronous operation mode signal and transmitting or blocking the address in response to the first control signal; and an asynchronous operation address circuit receiving the address in response to the asynchronous operation mode signal or the synchronous operation mode signal, storing the address in the address register in response to the first control signal or the second control signal, outputting the address stored in the address register in response to the third control signal, and determining whether the address received with the data read command is equal to the address stored in the address register, and generating a bypass signal according to the determination result.

The bypass signal has a first level if the address received with the data read command is equal to the address stored in the address register, and has a second level if the address received with the data read command is different from the address stored in the address register.

The synchronous operation address circuit comprises: a first address switch receiving the address in response to the synchronous operation mode signal; and a second address switch transmitting or blocking the address in response to the first control signal, and the asynchronous operation address circuit comprises: a third address switch receiving the address in response to the asynchronous operation mode signal or the synchronous operation mode signal; a fourth address switch transmitting or blocking the address output from the third address switch in response to the first control signal or the second control signal; the address register storing the address output from the fourth address switch; a fifth address switch transmitting or blocking the address stored in the address register in response to the third control signal; and a comparator determining whether the address received with the data read command is equal to the address stored in the address register and generating the bypass signal according to the determination result.

The read data controller comprises an output selector for selectively outputting one of the data stored in the data register and the data stored in the second memory cell in response to the bypass signal, and the output selector selects the data stored in the second memory cell if the bypass signal has the second level and selects the data stored in the data register if the bypass signal has the first level.

The semiconductor memory device has a synchronous operation mode in which the semiconductor memory device operates in synchronization with a clock signal, and an asynchronous operation mode in which the semiconductor memory device does not operate in synchronization with the clock signal. The semiconductor memory device is a PSRAM. The semiconductor memory device comprises a plurality of memory cells.

According to another aspect of the present invention, there is provided a data write and read method performed by a semiconductor memory device, comprising: determining whether an operation mode of the semiconductor memory device is a synchronous operation mode or an asynchronous operation mode; if the operation mode of the semiconductor memory device is the synchronous operation mode, writing data received with an address to a first memory cell corresponding to the address, storing the address in an address register, and storing the data in a data register; determining whether the operation mode of the semiconductor memory device is converted from the synchronous operation mode to the asynchronous operation mode; if the operation mode of the semiconductor memory device is converted from the synchronous operation to the asynchronous operation mode, determining whether an address received with a data read command is equal to an address stored in the address register; and if the received address is equal to the address stored in the address register, outputting the data stored in the data register.

The data write and read method further comprises: if the operation mode of the semiconductor memory device is not converted from the synchronous operation mode to the asynchronous operation mode, performing data write and read operations in the synchronous operation mode, wherein the data write operation in the synchronous operation mode is performed by writing the data to the first memory cell and simultaneously storing the address in the address register and storing the data in the data register, and the data read operation in the synchronous operation mode is performed by reading stored data from first the memory cell.

The data write and read method further comprises: if the address received with the data read command is different from the address stored in the address register, outputting data stored in a second memory cell corresponding to the received address. The data write and read method further comprises: if the operation mode of the semiconductor memory device is the asynchronous operation mode, performing data write and read operations in the asynchronous operation mode.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
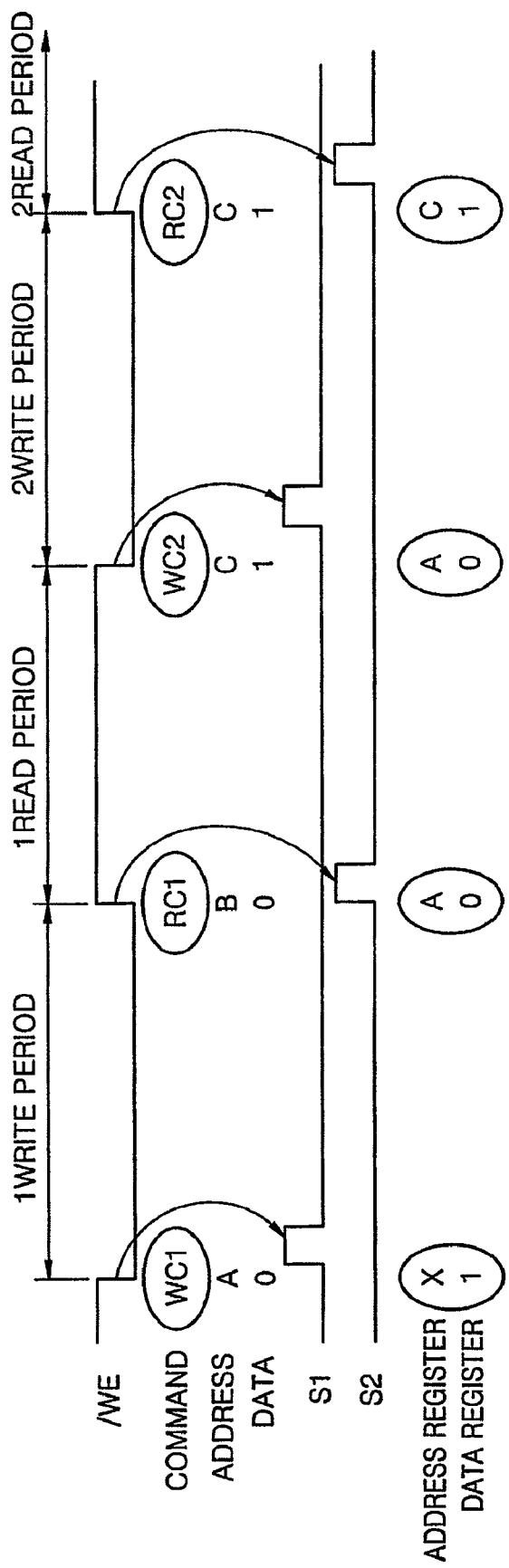
FIG. 1 is a timing diagram for explaining a late write function and a bypass read function in an asynchronous operation mode of a PSRAM.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their descriptions will not be repeated.

Figure 2:
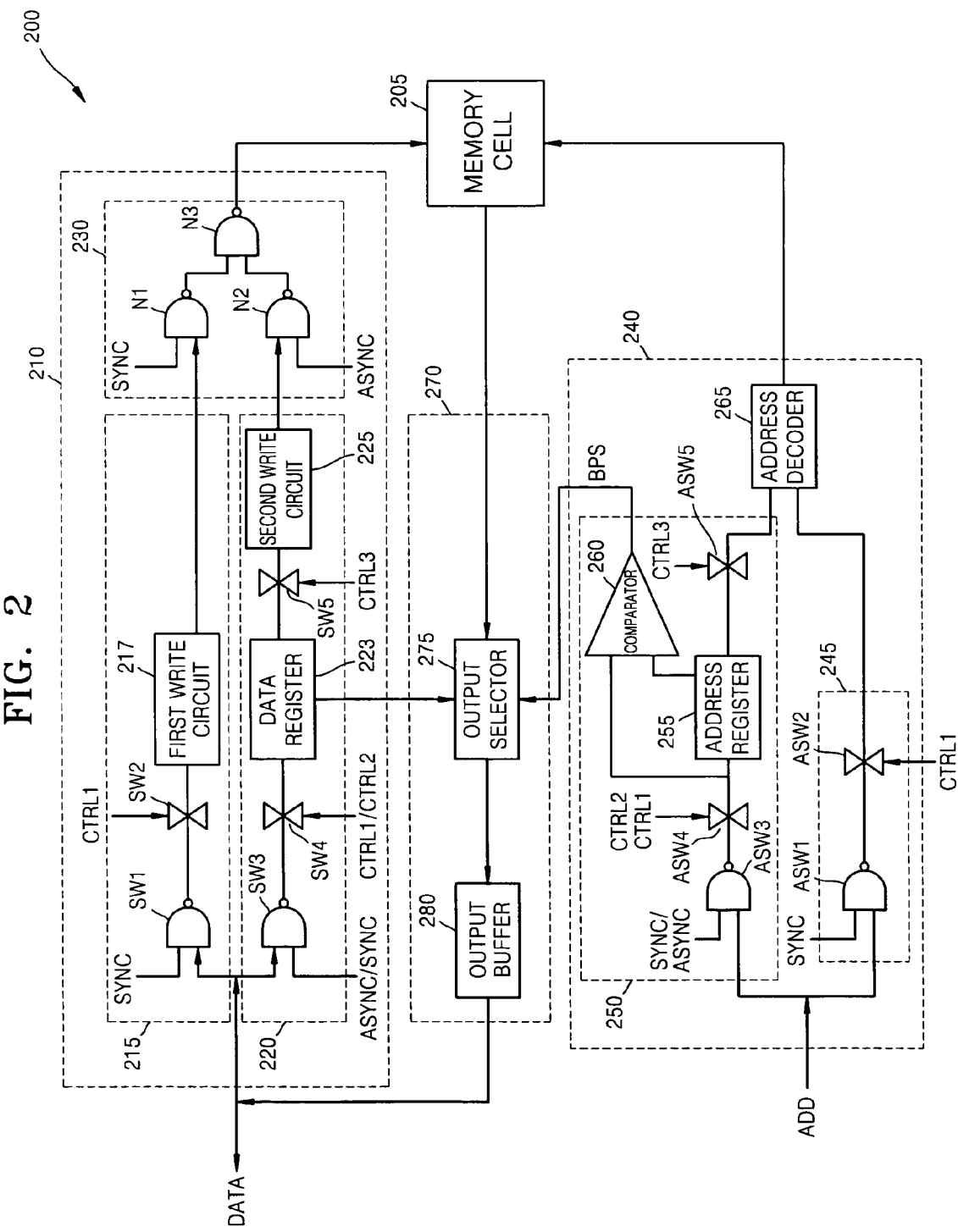
FIG. 2 is a block diagram of a semiconductor memory device according to an exemplary embodiment of the present invention.

FIG. 2 is a block diagram of a semiconductor memory device 200 according to an embodiment of the present invention.

Referring to FIG. 2, the semiconductor memory device 200 includes a write data controller 210, an address controller 240, and a read data controller 270 coupled to a memory cell 205 of, for example, a plurality of memory cells.

The write data controller 210 writes data DATA received with an address ADD to the memory cell 205, which corresponds to the address ADD, and simultaneously stores the data DATA in a data register 223. The address controller 240 decodes and stores the address ADD in an address register 255.

The read data controller 270 outputs data from one of the memory cells 205 corresponding to an address received with a data read command if the received address is different from the address ADD stored in the address register 255. If the received address is equal to the address ADD stored in the address register 255, the read data controller 270 outputs data from the data register 223.

Figure 3:
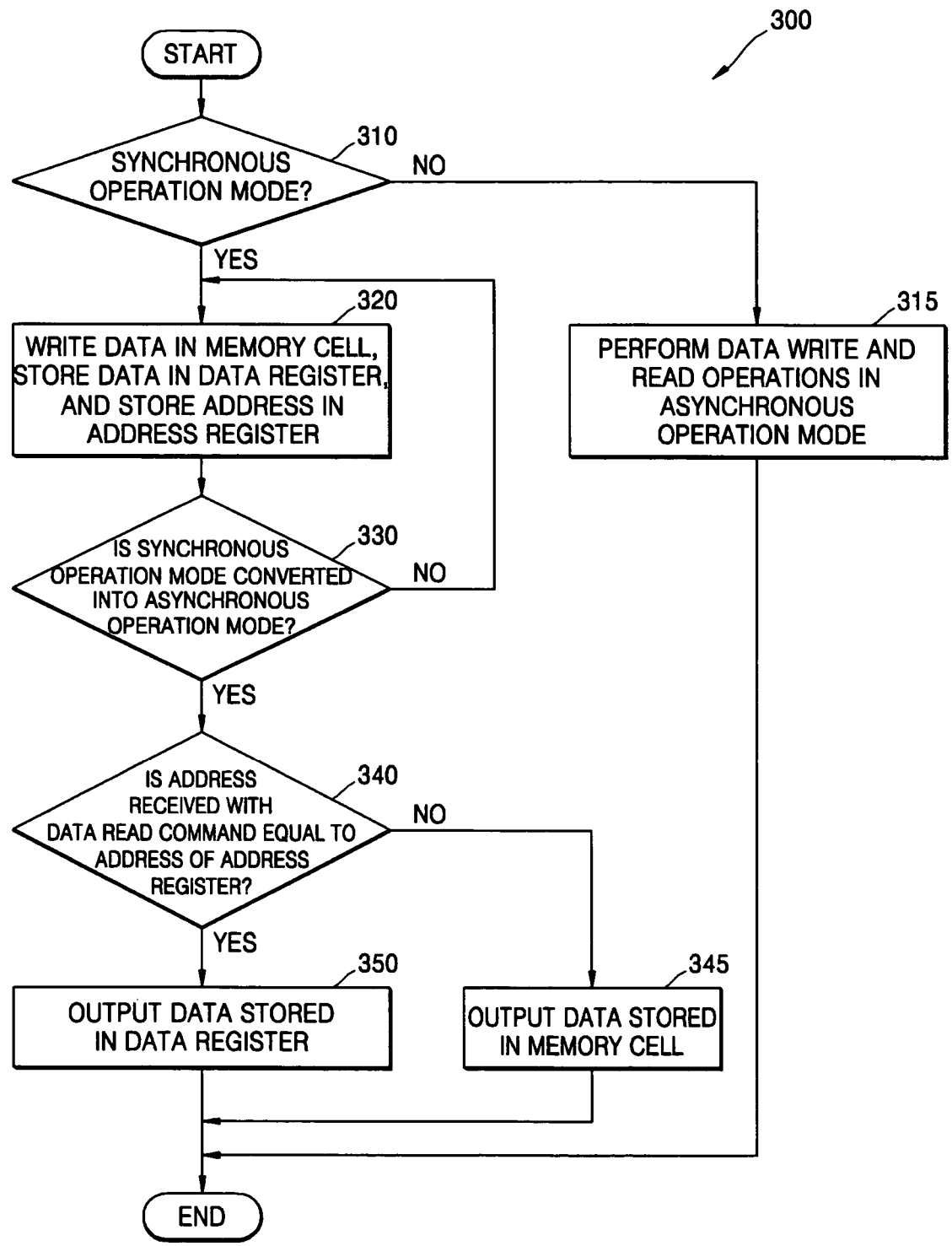
FIG. 3 is a flowchart illustrating a data write and read method according to an exemplary embodiment of the present invention.

FIG. 3 is a flowchart illustrating a data write and read method performed by the semiconductor memory device 200 in FIG. 2. Hereinafter, the data write and read method performed by the semiconductor memory device 200 will be described in detail with reference to FIGS. 2 and 3.

As shown in FIG. 3, it is first determined whether the semiconductor memory device 200 is operating in a synchronous operation mode or in an asynchronous operation mode (310).

It is to be understood that the semiconductor memory device 200 can have a synchronous operation mode in which the semiconductor memory device 200 operates in synchronization with a clock signal, and an asynchronous operation mode in which the semiconductor memory device 200 does not operate in synchronization with a clock signal. The semiconductor memory device 200 may be a PSRAM.

In the synchronous operation mode, the received address ADD is written to the address register 255, and the data DATA received with the address ADD is written simultaneously to the memory cell 205 corresponding to the address ADD and to the data register 223 (320).

The write data controller 210 writes the data DATA received with the address ADD to the memory cell 205 corresponding to the address ADD and simultaneously stores the data DATA in the data register 223.

In detail, as shown in FIG. 2, the write data controller 210 includes a synchronous operation write circuit 215 and an asynchronous operation write circuit 220.

The synchronous operation write circuit 215 receives the data DATA in response to a synchronous operation mode signal SYNC and writes the data DATA to the corresponding memory cell 205 in response to a first control signal CTRL1. The first control signal CTRL1 is activated in response to a write enable signal (not shown) in the synchronous operation mode.

The synchronous operation write circuit 215 includes a first switch SW1 and a second switch SW2. The first switch SW1 receives the data DATA in response to the synchronous operation mode signal SYNC. In the present embodiment, the synchronous operation mode signal SYNC is activated to a high level in the synchronous operation mode. However, the synchronous operation mode signal SYNC may be activated, for example, to a low level in the synchronous operation mode.

If the synchronous operation mode signal SYNC is activated to the high level, the first switch SW1 outputs the data DATA. In FIG. 2, the first switch SW1 is shown as a NAND device, however, the first switch SW1 is not limited to this.

The second switch SW2 transmits or blocks the data DATA received from the first switch SW1 to or from the corresponding memory cell 205, in response to the first control signal CTRL1. Since the first control signal CTRL1 is activated in the synchronous operation mode, the second switch SW2 is also activated in the synchronous operation mode. Thus, the second switch SW2 outputs the data DATA. The second switch SW2 may be any device capable of outputting or blocking an input signal in response to a predetermined control signal.

The synchronization operation write circuit 215 further includes a first write circuit 217 for writing the data DATA output from the second switch SW2 to the corresponding memory cell 205. The first write circuit 217 can be any circuit used for receiving the data DATA and writing it to the corresponding memory cell 205.

The write data controller 210 further includes a selector 230 for selectively outputting the data DATA received from the synchronous operation write circuit 215 or the asynchronous operation write circuit 220 to the corresponding memory cell 205, in response to the synchronous operation mode signal SYNC and the asynchronous operation mode signal ASYNC.

The selector 230 includes a first NAND device N1 for outputting the data DATA in response to the synchronous operation mode signal SYNC, a second NAND device N2 for outputting the data DATA in response to the asynchronous operation mode signal ASYNC, and a third NAND device N3 for performing a NAND operation on the outputs of the first NAND device N1 and the second NAND device N2.

Since the synchronous operation mode signal SYNC is activated to the high level in the synchronous operation mode, the data DATA output from the first write circuit 217 is applied to the memory cell 205 via the first NAND device N1. In addition, since the asynchronous operation mode signal ASYNC is deactivated to a low level in the synchronous operation mode, the second NAND device N2 does not operate.

The operation of the synchronous operation write circuit 215 in the synchronous operation mode is the same as that of a conventional write operation. However, in the semiconductor memory device 200, the asynchronous operation write circuit 220 also operates in the synchronous operation mode.

For example, the asynchronous operation write circuit 220 receives the data DATA in response to the asynchronous operation mode signal ASYNC or the synchronous operation mode signal SYNC and stores the data DATA in the data register 223 in response to the first control signal CTRL1 or a second control signal CTRL2.

In addition, the asynchronous operation write circuit 220 writes the data DATA stored in the data register 223 to the corresponding memory cell 205 in response to a third control signal CTRL3.

In detail, as shown in FIG. 2, the asynchronous operation write circuit 220 includes third through fifth switches SW3, SW4, and SW5. The third switch SW3 receives the data DATA in response to the synchronous operation mode signal SYNC. In FIG. 2, the third switch SW3 is shown as a NAND device, however, the third switch SW3 is not limited to this.

The fourth switch SW4 transmits or blocks the data DATA output from the third switch SW3 in response to the first control signal CTRL1. The fourth switch SW4 may be any device capable of outputting or blocking an input signal in response to a predetermined control signal.

Since the first control signal CTRL1 is activated in the synchronous operation mode, the fourth switch SW4 is also activated in the synchronous operation mode. Thus, the fourth switch SW4 stores the data DATA in the data register 223.

The asynchronous operation write circuit 220 further includes a second write circuit 225 for writing the data DATA output from the fifth switch SW5 to the corresponding memory cell 205. The operations of the fifth switch SW5 and the second write circuit 225 of the asynchronous operation write circuit 220 will be described later.

In summary, the write data controller 210 writes the data DATA to the corresponding memory cell 205 and simultaneously stores the data DATA in the data register 223, in response to the synchronous operation mode signal SYNC activated in the synchronous operation mode.

Referring still to FIG. 2, the address controller 240 includes a synchronous operation address circuit 245 and an asynchronous operation address circuit 250.

The synchronous operation address circuit 245 receives the address ADD in response to the synchronous operation mode signal SYNC and transmits or blocks the address ADD in response to the first control signal CTRL1. The synchronous operation address circuit 245 includes first and second address switches ASW1 and ASW2.

The first address switch ASW1 receives the address ADD in response to the synchronous operation mode signal SYNC. In FIG. 2, the first address switch ASW1 is shown as a NAND device, however, the first address switch ASW1 is not limited to this.

The second address switch ASW2 transmits or blocks the address ADD received from the first address switch ASW1 in response to the first control signal CTRL1 and the address ADD is decoded by the address decoder 265. The second address switch ASW2 may be any device capable of outputting or blocking an input signal in response to a predetermined control signal.

The asynchronous operation address circuit 250 receives the address ADD in response to the asynchronous operation mode signal ASYNC or the synchronous operation mode signal SYNC, and stores the address ADD in the address register 255 in response to the first control signal CTRL1 or the second control signal CTRL2.

In addition, the asynchronous operation address circuit 250 outputs the address ADD stored in the address register 255 in response to the third control signal CTRL3, and determines whether an input address ADD is equal to the address ADD stored in the address register 255, and generates a bypass signal BPS according to the determination result.

The asynchronous operation address circuit 250 includes third through fifth address switches ASW3, ASW4, and ASW5, an address register 255, and a comparator 260.

The operation of the asynchronous operation-address circuit 250 in the synchronous operation mode will now be described in more detail. For example, the third address switch ASW3 receives the address ADD in response to the synchronous operation mode signal SYNC. In FIG. 2, the third address switch ASW3 is shown as a NAND device, however, the third address switch ASW3 is not limited to this.

The fourth address switch ASW4 transmits or blocks the address ADD received from the third address switch ASW3 in response to the first control signal CTRL1. The address register 255 stores the address ADD output from the fourth address switch ASW4. In other words, the asynchronous operation address circuit 250 stores an input address ADD in the address register 255 in response to the synchronous operation mode signal SYNC and the first control signal CTRL1.

As described above, a data write operation in the synchronous operation mode (320) is performed by writing the data DATA to the memory cell 205 corresponding to the address ADD received in response to the write enable signal (not shown) and simultaneously storing the data DATA and the address ADD in the data register 223 and the address register 255, respectively.

Thereafter, it is determined whether the operation mode of the semiconductor memory device 200 is converted from the synchronous operation mode to an asynchronous operation mode (330). If the operation mode of the semiconductor memory device 200 is converted into an asynchronous operation mode, it is determined whether an address ADD received with a data read command (not shown) is equal to the address stored in the address register 255 (340).

For example, if the operation mode of the semiconductor memory device 200 is not converted into the asynchronous operation mode, data writing or reading in the synchronous operation mode continues to be performed.

If a command received after the synchronous operation mode is converted into the asynchronous operation mode is the data read command, it is determined by the asynchronous operation address circuit 250 whether the received address ADD is equal to the address stored in the address register 255 (340).

In the asynchronous operation mode, the third address switch ASW3 outputs the received address ADD to the fourth address switch ASW4 in response to the asynchronous operation mode signal ASYNC. The fourth address switch ASW4 outputs the address ADD received in response to the second control signal CTRL2. The second control signal CTRL2 is activated in response to the data read command (not shown) in the asynchronous operation mode.

Then, the comparator 260 determines whether the address ADD is equal to the address stored in the address register 255 and generates the bypass signal BPS according to the determination result. The bypass signal BPS has a first level if the address ADD is equal to the address stored in the address register 255; otherwise the bypass signal BPS has a second level.

If the received address ADD is equal to the address stored in the address register 255, the data DATA stored in the data register 223 is output (350). If the received address ADD is different than the address stored in the address register 255, the data DATA stored in the corresponding memory cell 205 is output by the read data controller 270 (345).

The read data controller 270 outputs the data DATA from the memory cell 205 corresponding to the address ADD received with the data read command (not shown) if the received address ADD is different from the address stored in the address register 255. If, however, the received address ADD is equal to the address stored in the address register 255, the read data controller 270 outputs the data DATA stored in the data register 223.

In more detail, as shown in FIG. 2, the read data controller 270 includes an output selector 275 for selectively outputting one of the data DATA stored in the data register 223 and the data DATA stored in the memory cell 205, in response to the bypass signal BPS.

The output selector 275 selects the data DATA stored in the memory cell 205 if the bypass signal BPS has the second level, and selects the data DATA stored in the data register 223 if the bypass signal BPS has the first level.

The read data controller 270 further includes an output buffer 280 for buffering data output from the output selector 275.

As described above, when a data write operation is performed in the synchronous operation mode of the semiconductor memory device 200, by writing data to the memory cell 205 and simultaneously updating the data DATA and the address ADD stored in the data register 223 and the address register 255, correct data can be output even when a data read operation is performed after the synchronous operation mode has been converted into the asynchronous operation mode.

Referring again to FIG. 3, if it is determined in operation 310 that the operation mode of the semiconductor memory device 200 is the asynchronous operation mode, data write and read operations in the asynchronous operation mode are performed (315).

For example, if the asynchronous operation mode signal ASYNC is activated while a data write operation is being performed in the asynchronous operation mode, the third switch SW3 is turned on and the data DATA is received. At this time, the fifth switch SW5 transmits the data DATA stored in the data register 223 to the second write circuit 225 in response to the third control signal CTRL3.

The third control signal CTRL3 is activated in response to a data write command (not shown) in the asynchronous operation mode. The second write circuit 225 may be any circuit capable of receiving the data DATA and writing it to the corresponding memory cell 205.

The data DATA output from the second write circuit 225 is written to the memory cell 205 corresponding to the address ADD decoded by the address decoder 265 via the second NAND device N2 and the third NAND device N3 of the selector 230.

The data DATA received when the third switch SW3 is turned on is stored in the data register 223 via the fourth switch SW4 when the second control signal CTRL2 is activated. This operation is the same as the general late write operation.

Now, the operation of the address controller 240 will be described. If the asynchronous operation mode signal ASYNC is activated while a data write operation is being performed in the asynchronous operation mode, the third address switch ASW3 is turned on and the address ADD is received.

At this time, the third address switch ASW5 transmits the address ADD stored in the address register 255 to the address decoder 265 in response to the third control signal CTRL3. The address decoder 265 decodes and outputs the address ADD.

The address ADD received when the third address switch ASW3 is turned on is stored in the address register 255 via the fourth address switch ASW4 when the second control signal CTRL2 is activated. This operation is the same as the general late write operation.

As described above, in a semiconductor memory device and a data write and read method thereof according to an embodiment of the preset invention, data output errors are prevented from being generated when a data read operation is performed at an address in an asynchronous operation mode after a data write operation has been performed at the same address in a synchronous operation mode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a write data controller writing data received with an address to a memory cell corresponding to the address and storing the data in a data register in parallel with writing the data to the memory cell according to a synchronous operation mode signal and an asynchronous operation mode signal;
   an address controller decoding and storing the address in an address register according to the synchronous operation mode signal and the asynchronous operation mode signal; and
   a read data controller outputting data from the memory cell corresponding to an address received with a data read command if the received address is different from the address stored in the address register, and outputting the data stored in the data register if the received address is equal to the address stored in the address register,
   wherein the write data controller comprises:
   a synchronous operation write circuit receiving the data to be written in response to the synchronous operation mode signal and writing the data to the memory cell in response to a first control signal; and
   an asynchronous operation write circuit receiving the data to be written in response to the asynchronous operation mode signal or the synchronous operation mode signal, storing the data to be written in the data register in response to the first control signal or a second control signal, and writing the data stored in the data register to the memory cell in response to a third control signal.

2. The semiconductor memory device of claim 1, wherein the first control signal is activated in response to a write enable signal in the synchronous operation mode, the second control signal is activated in response to a data read command in the asynchronous operation mode, and the third control signal is activated in response to a data write command in the asynchronous operation mode.

3. The semiconductor memory device of claim 1, wherein the synchronous operation write circuit comprises:
- a first switch receiving the data to be written in response to the synchronous operation mode signal; and
- a second switch transmitting or blocking the data output from the first switch to the memory cell in response to the first control signal, and the asynchronous operation write circuit comprises:
- a third switch receiving the data to be written in response to the asynchronous operation mode signal or the synchronous operation mode signal;
- a fourth switch transmitting or blocking the data output from the third switch in response to the first control signal or the second control signal;
- the data register storing the data output from the fourth switch; and
- a fifth switch transmitting or blocking the data stored in the data register in response to the third control signal.

4. The semiconductor memory device of claim 3, wherein the synchronous operation write circuit further comprises a first write circuit for writing the data output from the second switch to the memory cell, and
the asynchronous operation write circuit further comprises a second write circuit for writing the data output from the fifth switch to the memory cell.

5. The semiconductor memory device of claim 1, wherein the write data controller further comprises a selector for selecting the data output from the synchronous operation write circuit or the asynchronous operation write circuit in response to the synchronous operation mode signal and the asynchronous operation mode signal, and applying the selected data to the memory cell.

6. The semiconductor memory device of claim 5, wherein the selector comprises:
- a first logic gate outputting the data output from the first write circuit in response to the synchronous operation mode signal;
- a second logic gate outputting the data output from the second write circuit in response to the asynchronous operation mode signal; and
- a third logic gate receiving the output of the first logic gate and the second logic gate, performing a logic operation on the output of the first logic gate and the second logic gate and outputting a result of the logic operation to the memory cell.

7. The semiconductor memory device of claim 1, wherein the address controller comprises:
- a synchronous operation address circuit receiving the address in response to the synchronous operation mode signal and transmitting or blocking the address in response to the first control signal; and
- an asynchronous operation address circuit receiving the address in response to the asynchronous operation mode signal or the synchronous operation mode signal, storing the address in the address register in response to the first control signal or the second control signal, outputting the address stored in the address register in response to the third control signal, and determining whether the address received with the data read command is equal to the address stored in the address register, and generating a bypass signal according to a result of the determination.

8. The semiconductor memory device of claim 7, wherein the bypass signal has a first level if the address received with the data read command is equal to the address stored in the address register, and has a second level if the address received with the data read command is different from the address stored in the address register.

9. The semiconductor memory device of claim 7, wherein the synchronous operation address circuit comprises:
- a first address switch receiving the address in response to the synchronous operation mode signal; and
- a second address switch transmitting or blocking the address in response to the first control signal, and the asynchronous operation address circuit comprises:
- a third address switch receiving the address in response to the asynchronous operation mode signal or the synchronous operation mode signal;
- a fourth address switch transmitting or blocking the address output from the third address switch in response to the first control signal or the second control signal;
- the address register storing the address output from the fourth address switch;
- a fifth address switch transmitting or blocking the address stored in the address register in response to the third control signal; and
- a comparator determining whether the address received with the data read command is equal to the address stored in the address register and generating the bypass signal according to a result of the determination.

10. The semiconductor memory device of claim 7, wherein the read data controller comprises an output selector for selectively outputting one of the data stored in the data register and the data stored in the memory cell in response to the bypass signal, and
the output selector selects the data stored in the memory cell if the bypass signal has the second level and selects the data stored in the data register if the bypass signal has the first level.

11. The semiconductor memory device of claim 1, wherein the semiconductor memory device has a synchronous operation mode in which the semiconductor memory device operates in synchronization with a clock signal, and an asynchronous operation mode in which the semiconductor memory device does not operate in synchronization with the clock signal.

12. The semiconductor memory device of claim 1, wherein the semiconductor memory device is a Pseudo Static Random Access Memory (PSRAM).

13. The semiconductor memory device of claim 1, further comprising:
- a plurality of memory cells.

14. A semiconductor memory device comprising:
- a write data controller writing data received with an address to a memory cell corresponding to the address and storing the data in a data register in parallel with writing the data to the memory cell according to a synchronous operation mode signal and an asynchronous operation mode signal;
- an address controller decoding and storing the address in an address register according to the synchronous operation mode signal and the asynchronous operation mode signal; and
- a read data controller outputting data from the memory cell corresponding to an address received with a data read command if the received address is different from the address stored in the address register, and outputting the data stored in the data register if the received address is equal to the address stored in the address register, wherein the semiconductor memory device is a Pseudo Static Random Access Memory (PSRAM).

* * * * *